(12) United States Patent
Yoneda et al.

(10) Patent No.: US 6,580,214 B2
(45) Date of Patent: *Jun. 17, 2003

(54) COLOR DISPLAY APPARATUS HAVING ELECTROLUMINESCENCE ELEMENTS

(75) Inventors: Kiyoshi Yoneda, Gifu (JP); Kenichi Shibata, Hashimoto (JP)

(73) Assignee: Sanyo Electric Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/999,626

(22) Filed: Oct. 31, 2001

(65) Prior Publication Data

US 2002/0036463 A1 Mar. 28, 2002

Related U.S. Application Data

(63) Continuation of application No. 09/259,130, filed on Feb. 26, 1999, now Pat. No. 6,392,340.

(30) Foreign Application Priority Data

Feb. 27, 1998 (JP) ............................................. 10-47564

(51) Int. Cl.[7] ................................................. H01J 1/62
(52) U.S. Cl. ....................................... 313/506; 313/112
(58) Field of Search ................... 313/506, 498, 313/499, 500, 501, 503, 112

(56) References Cited

U.S. PATENT DOCUMENTS

| | | | |
|---|---|---|---|
| 5,126,620 A | 6/1992 | Haraga et al. ............... 313/111 |
| 5,543,685 A | 8/1996 | Okamoto et al. ........... 313/496 |
| 5,550,066 A | 8/1996 | Tang et al. .................... 437/40 |
| 5,559,397 A | 9/1996 | Tsuruoka et al. ........... 313/496 |
| 5,640,067 A | 6/1997 | Yamauchi et al. .......... 313/504 |
| 5,670,792 A | 9/1997 | Utsugi et al. | |
| 5,677,594 A | 10/1997 | Sun et al. .................... 313/503 |
| 5,714,968 A | 2/1998 | Ikeda .......................... 345/77 |
| 5,754,001 A | 5/1998 | Ohno et al. ................. 313/497 |
| 5,909,081 A | 6/1999 | Eida et al. ................... 313/504 |
| 5,932,327 A | 8/1999 | Inoguchi et al. ............ 428/212 |
| 5,990,629 A | 11/1999 | Yamada et al. | |
| 6,037,712 A | 3/2000 | Codama ...................... 313/498 |
| 6,072,450 A | 6/2000 | Yamada et al. ................ 345/76 |
| 6,114,715 A | 9/2000 | Hamada ........................ 257/72 |

FOREIGN PATENT DOCUMENTS

| | | |
|---|---|---|
| JP | 3-34292 | 2/1991 |
| JP | 3-289090 | 12/1991 |
| JP | 7-57871 | 3/1995 |
| JP | 7-111341 | 4/1995 |
| JP | 8-54836 | 2/1996 |
| JP | 8-124679 | 5/1996 |
| JP | 8-222369 | 8/1996 |
| JP | 9-245968 | 9/1997 |
| JP | 9-330792 | 12/1997 |
| JP | 10-39792 | 2/1998 |
| JP | 10-161563 | 6/1998 |
| JP | 10-189252 | 7/1998 |
| JP | 10-289784 | 10/1998 |

*Primary Examiner*—Frank G. Font
*Assistant Examiner*—Layla Lauchman
(74) *Attorney, Agent, or Firm*—Cantor Colburn LLP

(57) ABSTRACT

A color display apparatus comprises a substrate; thin film transistors formed on the substrate, each of the thin film transistors having a source electrode and a drain electrode; electroluminescence elements respectively formed over the thin film transistors and driven by the thin film transistors, each of the electroluminescence elements having a cathode connected to a source electrode or drain electrode of a thin film transistor, a luminous element layer, and an anode electrode sequentially disposed thereover. A color filter or fluorescent color conversion layer acting as a color element is formed on the side of the anode electrode of an electroluminescence element. The same luminous layer material is used for each display pixel to display a color image.

33 Claims, 4 Drawing Sheets

COLOR DISPLAY APPARATUS HAVING ELECTROLUMINESCENCE ELEMENTS

CROSS REFERENCE TO RELATED APPLICATIONS

This application is a continuation application of U.S. patent Ser. No. 09/259,130, filed on Feb. 26, 1999, now U.S. Pat. No. 6,392,340, which is herein incorporated by reference in its entirety.

BACKGROUND OF THE INVENTION

1. Field of the Invention

The present invention relates to a color display apparatus that includes electroluminescence (hereinafter referred to as EL) elements and thin film transistors (hereinafter referred to as TFTs) fabricated on a substrate.

2. Description of the Related Art

Recently, color display apparatuses incorporating EL elements have been noted as color display devices, in place of the CRTs (Cathode Ray Tubes) or LCD (Liquid Crystal Display) panels.

FIG. 1 is a cross sectional view illustrating a conventional color display apparatus including EL elements and TFT elements. Referring to FIG. 1, thin film transistors are formed on an insulation substrate 2 of glass or synthetic resin. Each TFT is prepared by successively forming on the insulation substrate 2 a gate electrode 3, a gate insulation film 4, an active layer 5 having a source region 6 and a drain region 7, an interlayer insulation film 8, a source electrode 9 connected to the source region 6, a drain electrode 10 connected to the drain region 7, and a leveled insulation film 11. Each source electrode 9 is connected to the anode electrode 37 of an organic EL element. The TFT element acts as a switching element for an organic EL element.

The organic EL elements are respectively formed on the TFT elements. Each EL element is constructed by successively forming an anode electrode 37, a second hole transfer layer 36, a first hole transfer layer 35, a luminous layer 34, an electron transfer layer 33, and a cathode electrode 32. The anode electrode 37 is made of a transparent electrode of ITO (Indium Tin Oxide) connected to the source electrode of a TFT element. The second hole transfer layer 36 is made of MTDATA(4,4'-bis (3 methylphenylphenylamino) biphenyl). The first hole transfer layer 35 is made of TPD (4,4',4"-tris (3-methylphenylphenylamino) triphenylamine). The electron transfer layer 33 is made of Bebq2. The cathode electrode 32 is made of MgIn (Magnesium Indium) alloy. The layers except the electrodes are made of an organic chemical compound. An EL element is formed of the respective organic layers as well as the anode electrode 37 and the cathode electrode 32.

In the EL element, holes injected from the anode electrode 37 are recombined with electrons injected from the cathode electrode 32 in the luminous layer 34. Thus, organic molecules of the luminous layer 34 are excited so that excitons are generated. In the process during which excitons disappear, the luminous layer 34 emits light. The emitted light are radiated out from the transparent anode electrode via the transparent insulation substrate 2 (in the arrow direction in FIG. 1).

In the conventional structure, in order to form images, for example, in three primary colors including R (red), G (green) and B (blue) emitted from organic EL elements, a red luminous material, a green luminous material and a blue luminous material must be selected for the luminous layers 34. For example, porphyrin-zinc complex (ZnPr) is used for red; 10 benzo [h] quinolinol-beryllium complex (Bebq2) is used for green; and azo-methine-zinc complex (AZM) is used for blue. Since the color luminous layers are separately formed by successively performing different steps, the number of fabrication steps is increased.

Moreover, since colored light emitted from each organic EL element is blocked by the TFT area formed on the substrate 2, it is difficult to obtain sufficiently bright, clear images.

SUMMARY OF THE INVENTION

The present invention is made to solve the above-mentioned problems involved in the conventional color display apparatus. It is an object of the invention to provide a color display apparatus that can realize an increased color area and clear sharp color images and can simplify the fabrication process by forming the luminous layer of an organic EL element with one type of material (or one color material).

According to the present invention, the color display apparatus comprises a substrate; thin film transistors formed on the substrate, each of the thin film transistors having a source electrode and a drain electrode; electroluminescence elements respectively formed over the thin film transistors, each of the electroluminescence elements having a cathode connected to a source electrode or drain electrode of a thin film transistor, a luminous layer, and an anode layer sequentially formed thereover; and color elements respectively arranged on the sides of anode electrodes of the electroluminescence elements.

In the color display apparatus according to the present invention, each of the color elements comprises a color filter layer formed on a transparent substrate.

Moreover, each of the color elements comprises a color filter layer through which light of a predetermined wavelength among emitted light from the luminous layer can pass.

Each of the color elements comprises a color filter layer formed on a transparent substrate, the color filter passing light of a predetermined wavelength among beams of light from the luminous layer.

In the color display apparatus defined in the present invention, the luminous layer of each of the electroluminescence elements is formed of a white luminous material; and the color filter layer includes a layer for red light through which red light within white light emitted from the luminous layer passes, a layer for green light through which green light within the white light passes and a layer for blue light through which blue light within the white light passes.

Moreover, in the color display apparatus according to the present invention, each of the color elements comprises a fluorescent light conversion layer formed on a transparent substrate.

Each of the color elements comprises a fluorescent light conversion layer for converting light from the luminous layer into light of a predetermined wavelength.

Each of the color elements may be formed of a fluorescent light conversion layer formed on a transparent substrate, for converting light from the luminous layer into light a predetermined wavelength.

The color conversion layer of fluorescent materials may be formed of a layer for red light which converts light emitted from said luminous layer into red light, a layer for green light which converts light into green light, and a layer for blue light which converts light into blue light.

In the color display apparatus according to the present invention, a color filter layer or color conversion layer acting as a color element is formed on a transparent substrate and can be bonded to an organic EL element. Moreover, since the color element requires only one kind of color emitted from the organic EL element, it is not necessary to use plural kinds of luminous materials to the luminous element layers of the organic EL element, so that the fabrication process can be simplified.

In another aspect of the present invention, each of said anode electrodes in said EL elements is shaped in a comb, mesh, or grid planer pattern.

Since light in each display pixel is emitted from the color elements arranged over the anode electrode of the EL element, the luminous or display area become larger than a conventional EL element in which the luminescent light is emitted from the substrate on which the TFTs are formed, so that brighter, clearer color image can be displayed.

In the color display of the present invention, said EL element is able to comprise an organic EL element using an organic material for the luminous layer.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

[First Embodiment]

Next, an embodiment of a color display apparatus of the present invention will be described below with reference to the attached drawings.

Figure 2:
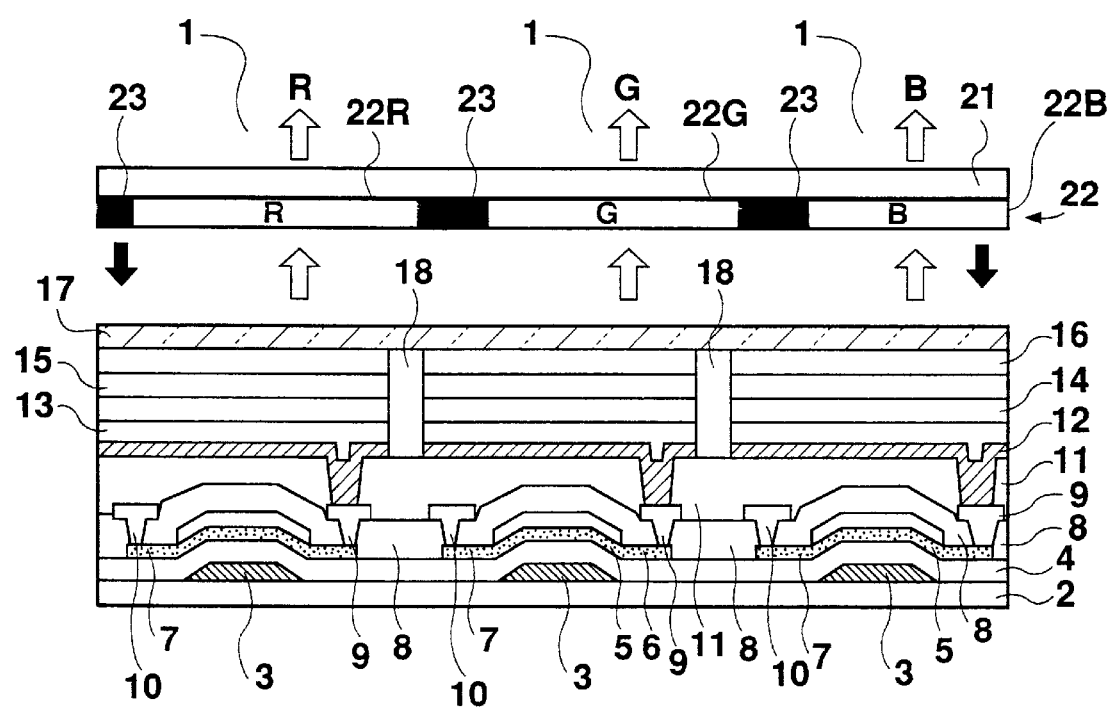
FIG. 2 is a cross sectional view schematically illustrating a color display apparatus according to a first embodiment of the present invention.

FIG. 2 is a cross sectional view illustrating a color display apparatus according to the present embodiment.

Figure 1:
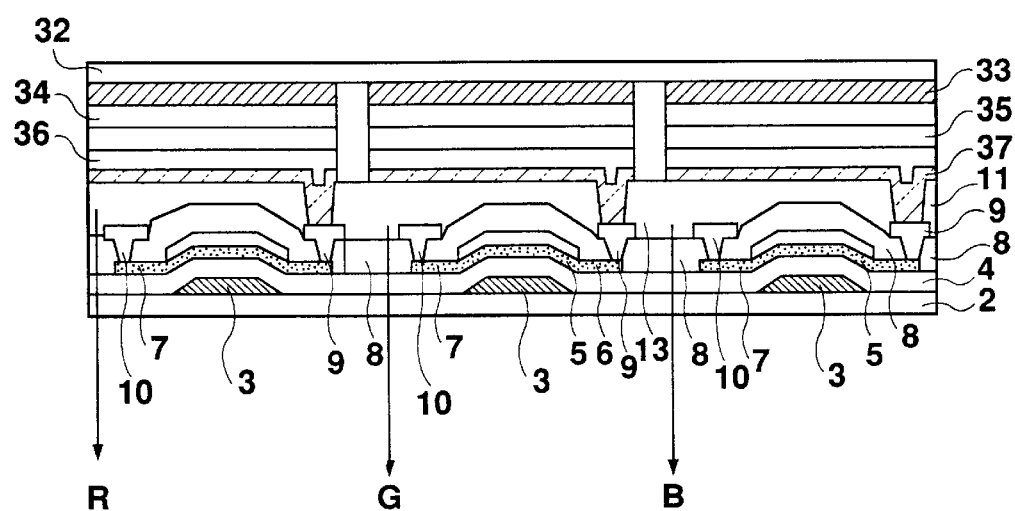
FIG. 1 is a cross sectional view schematically illustrating a conventional color display apparatus.

Referring to FIG. 2, the color display apparatus differs from the conventional display apparatus shown in FIG. 1 in the structure. That is, the structure where the organic EL elements are reversely placed over the TFT elements. Color filters acting as color elements are placed on the side of the anode electrodes of organic EL elements. The respective luminous layers are formed of one kind of luminous material (i.e. a luminous material for one color).

Display pixels 1 are formed by forming thin film transistors and organic EL elements in a stacked-up structure over an substrate 2, for example, an insulating substrate such as glass or synthetic resin, or a conductive substrate or semiconductor substrate having an insulation surface because of insulation thin films such as SiN or $SiO_2$ deposited on the substrate. The display pixels 1 are arranged in a matrix form to construct a color display apparatus. The substrate 2 may be a transparent or opaque substrate.

The TFT structure is a bottom-gate-type TFT structure where gate electrodes 3 are placed under the gate insulating film 4. This TFT structure is similar to the conventional TFT structure using polycrystalline silicon films acting as active layers. Hence, the repeated description will be omitted here. The source electrode 9 of a TFT transistor is connected to the cathode electrode 12 of an organic EL element. The TFT structure may be a top-gate-type TFT structure where gate electrodes are formed on the gate insulating film.

Each organic EL element is constructed by successively forming a cathode electrode 12 comprised a magnesium indium (MgIn) alloy or aluminum lithium (AlLi) alloy and connected to the source electrode 9 of a TFT transistor, an electron transfer layer 13 comprised Bebq2, a luminous layer 14, a first hole transfer layer 15 comprised TPD: triphenylamine dimer (4,4',4"-tris (3-methylphenylphenylamino) triphenylamine), and a second hole transfer layer 16 comprised MTDATA (4,4'-bis(3-methylphenylphenylamino)biphenyl), and an anode electrode 17 comprised a transparent electrode such as ITO (Indium Tin Oxide).

The light emitted from the organic EL element is sent outside the transparent anode 17 (in the upward orientation in FIG. 2). The anode electrode 17 is a common electrode. In each display pixel section, the luminous layer 14, the electron transfer layer 13, and the hole transfer layers 15 and 16 are isolated from adjacent pixel sections by means of the insulating film 18. Color filters acting as color elements are placed on the organic EL display apparatus.

As shown in FIG. 2, a color filter 22 having R, G and B filters confronts the anode electrode 17 and is placed on the transparent insulating substrate 21 such as transparent film or glass substrate.

The color filter 22 is securely bonded to the TFT structure with a bonding agent applied on the fringe of the anode electrode 17 of the organic EL element. The color filter 22 contains color filtering sections each corresponding to a display pixel 1 formed of the EL elements and the TFT elements. A black matrix (BM) 23 may be formed between the color filtering sections to block light.

The organic EL elements respectively emit red, green and blue rays through the color filter 22 in the arrow direction shown in FIG. 2.

Here, let us now explain the luminous material for the luminous layer in the organic EL element.

The luminous material for the luminous layer 14 is selected according to the color element placed over the organic EL element. In this embodiment, white light emitting luminous material is used for luminous layer 14 since the color filter (R, G, B) is used as the color element.

A ZnBTZ (zinc benzothiazole) complex is preferably selected as a white light emitting material for the luminous layer 14. Moreover, a laminated layer having TPD (aromatic diamine)/p-EtTAZ(1,2,4-triazole derivative)/Alq (aluminum quinolinol complex) (where "Alq" actually is partially doped with neal red being a red luminous pigment) may be used as a white light emitting material.

In the present embodiment, the luminous material is formed by using only one kind of white luminous material. The color display apparatus is formed by placing a three color filter including R, G and B over the transparent substrate 21 and bonding the color filter forming surface with the anode electrode side of the organic EL element. Hence, the fabrication process can be simplified, compared with the conventional manner where three kinds of luminous materials are formed inside the organic EL element to emit three primary colors.

Moreover, unlike the conventional structure, since light is emitted out as a color beam for a display pixel from the color filter mounted on the anode electrode side, the luminous area per pixel becomes large, so that brighter, clearer color images can be displayed.

[Second Embodiment]

Figure 3:
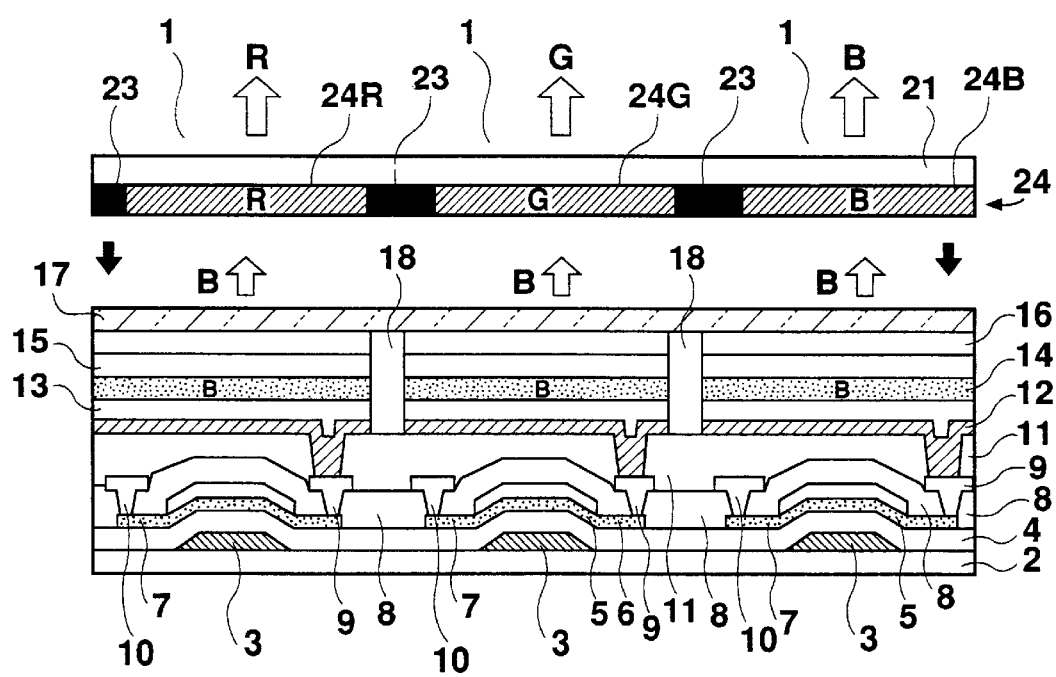
FIG. 3 is a cross sectional view schematically illustrating a color display apparatus according to a second embodiment of the present invention.

FIG. 3 is a cross sectional view illustrating a display apparatus using a fluorescent conversion layer acting as a color element.

The embodiment shown in FIG. 3 differs from the first embodiment in that a color conversion layer 24 of fluorescent materials is arranged over the anode electrodes 17 and that a blue luminous material, for example, is used as the material for the luminous layer 14.

A color conversion layer 24 is formed on the transparent substrate 21 such as a glass substrate by evaporating an organic material. The transparent substrate 21 is bonded to the anode electrode 17.

The case will be described below where a blue luminous material for a luminous layer in the organic EL element is used.

The color conversion layer 24 of a fluorescent material has the function of converting an irradiated color light into different color light. In order to provide a color display by making three primary colors R, G and B with a blue luminous material acting as a luminous layer 14, the color conversion layer 24 comprises a material which converts blue light into red or green light.

When blue light emitted from the luminous layer 14 in the organic EL element is converted into red light, 4-dicyanomethylene-2-methyl-6-(p-dimethylaminostyryl)-4H-pyran (DCM) is used as the color conversion layer 24R. Thus, the color conversion layer 24R converts blue light into red light to obtain a red light emitting display pixel.

Next, in order to convert blue light emitted from the organic EL element into green light, 2,3,5,6-1H, 4H-tetorahydro-8-trifluoromethylquinolidino (9,9a,1-gh) coumarin, for example, is used as the color conversion layer 24G. Thus, the color conversion layer 24G converts blue light into green light to obtain a green light emitting display pixel. Since the luminous layer 14 emits a blue light in this embodiment, no light conversion layer 24B for blue is theoretically needed in the display pixel from which a blue light should be emitted. In the present embodiment, the color conversion layer 24B is formed to improve the color purity of blue light. The same material as that for the luminous layer 14 is used as the color conversion layer 24B.

Oxadiazole (OXD), azomethine-zinc complex (AZM), and Al-quinoline mixed ligand complex and perylene may be used as a blue luminous material and a color conversion layer for blue.

In the embodiment, only one kind of blue luminous material may be used as the luminous layer for an organic EL element. Moreover, a single layer in which three kinds of fluorescent conversion materials are arranged side by side is formed over the transparent substrate 21. Hence, this structure allows the fabrication process to be significantly simplified, compared with the conventional structure where three kinds of luminous materials are formed as a luminous layer in an organic EL element to emit three primary color rays.

The case where the luminous layer 14 emits blue light has been described in the above-mentioned embodiment. However, it should be noted that the present invention is not limited to the above mentioned embodiments. The luminous layer 14 may emit red or green light. A color conversion layer which converts red light into blue or green light is used for the red luminous layer. A color conversion layer which converts green light into a red or blue light is used for the green luminous layer.

Figure 4A:
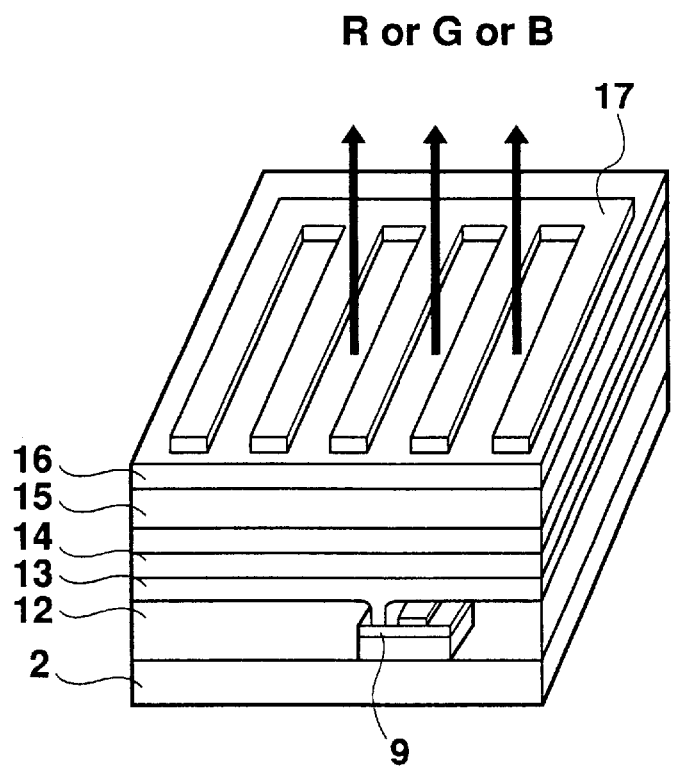
FIG. 4A is a perspective view schematically illustrating an anode structure in a color display apparatus according to an embodiment of the present invention.
Figure 4B:
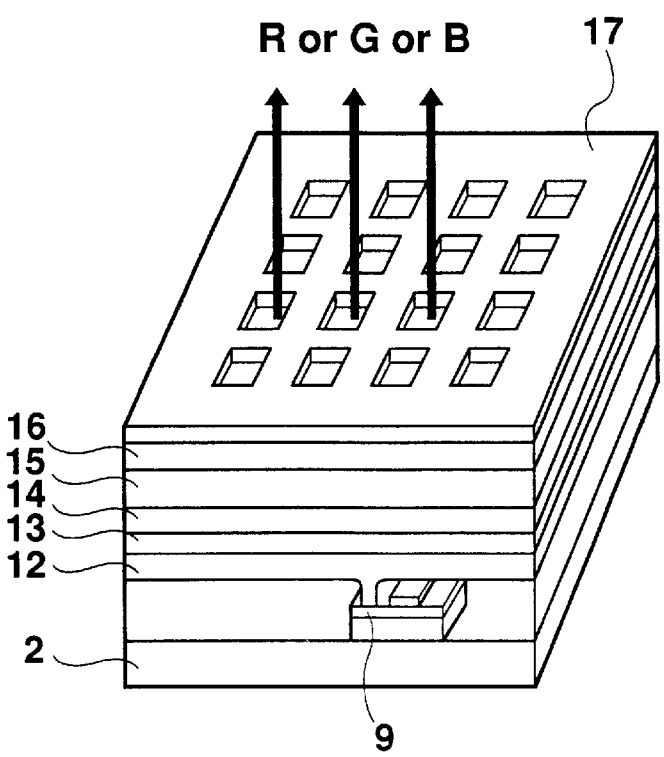
FIG. 4B is a perspective view schematically illustrating an anode structure in a color display apparatus according to an embodiment of the present invention.

Since the color conversion layer formed over the anode electrode can emit light, the embodiment can provide a larger color light emitting area, compared from the conventional structure and can display brighter, clearer color images. In the above-mentioned embodiments, ITO is used for the anode electrode 17. However, the anode electrode may be formed using a vacuum evaporating process or ion evaporating process. For example, aluminum anode electrodes may be formed using an ion cluster method. In that case, as shown in FIGS. 4A and 4B, in order to prevent the anode electrode 17 from blocking the light emitted from the organic EL element, the anode electrode 17 is shaped in the comb pattern shown in FIG. 4A or in the mesh or grid pattern shown in FIG. 4B to pass as much light as possible. The tooth space of the comb or the mesh or grid gap space of the mesh or grid are set according to a desired brightness of the color display.

What is claimed is:

1. A color display apparatus comprising:
    a substrate;
        thin film transistors formed on said substrate, each of said thin film transistors having a source electrode and a drain electrode;
        electroluminescence elements respectively formed over said thin film transistors, each of said electroluminescence elements having a lower electrode connected to one of said source electrode or said drain electrode of said thin film transistor, a luminous element layer including at least a luminous layer, and a light passing upper electrode, sequentially formed in that order; and
        color elements respectively arranged immediately above said upper electrode of said electroluminescence elements with no adhesive in between.

2. The color display apparatus defined in claim 1, wherein each of said color elements comprises a color filter layer formed on a transparent substrate.

3. The color display apparatus defined in claim 1, wherein each of said color elements comprises a color filter layer through which can pass light of a predetermined wavelength emitted from said luminous layer.

4. The color display apparatus defined in claim 3, wherein each of said color elements comprises a color filter layer formed on a transparent substrate, said color filter passing light of a predetermined wavelength emitted from said luminous layer.

5. The color display apparatus defined in claim 3, wherein the luminous layer of each of said electroluminescence elements includes of a white luminous material, and wherein said color filter layer includes a layer for red light through which red light within white light emitted from said luminous layer passes, a layer for green light through which green light within the white light emitted from said luminous layer passes, and a layer for blue light through which blue light within the white light emitted from said luminous layer light passes.

6. The color display apparatus defined in claim 1, wherein each of said color elements comprises a color conversion layer formed on a transparent substrate.

7. The color display apparatus defined in claim 1, wherein each of said color elements comprises a color conversion layer for converting light from said luminous layer into light of a predetermined wavelength.

8. The color display apparatus defined in claim 7, wherein each of said color elements comprises the color conversion layer formed on a transparent substrate, for converting light from said luminous layer into light of a predetermined wavelength.

9. The color display apparatus defined in claim 8, wherein said color conversion layer comprises a layer for red light which converts light emitted from said luminous layer into red light, a layer for green light which converts light emitted from said luminous layer into green light, and a layer for blue light which converts light emitted from said luminous layer into blue light.

10. The color display apparatus defined in claim 1, wherein each of said electroluminescence elements comprises an organic electroluminescence element using an organic material for said luminous layer.

11. A color display apparatus comprising:

a substrate;

thin film transistors formed on said substrate, each of said thin film transistors having a source electrode and a drain electrode;

electroluminescence elements respectively formed over said thin film transistors, each of said electroluminescence elements having a lower electrode connected to one of said source electrode or said drain electrode of said thin film transistor, a luminous element layer including at least a luminous layer, and a light passing upper electrode, sequentially formed in that order; and color elements respectively arranged on the side of said anodes of said electroluminescence elements, wherein each of said upper electrodes of said electroluminescence elements is shaped in a comb, mesh, or grid pattern through which light can pass.

12. The color display apparatus defined in claim 11, wherein each of said color elements comprises a color filter layer formed on a transparent substrate.

13. The color display apparatus defined in claim 11, wherein each of said color elements comprises a color filter layer through which can pass light of a predetermined wavelength emitted from said luminous layer.

14. The color display apparatus defined in claim 13, wherein each of said color elements comprises a color filter layer formed on a transparent substrate, said color filter passing light of a predetermined wavelength emitted from said luminous layer.

15. The color display apparatus defined in claim 13, wherein the luminous layer of each of said electroluminescence elements includes a white luminous material, and wherein said color filter layer includes a layer for red light through which red light within white light emitted from said luminous layer passes, a layer for green light through which green light within the white light emitted from said luminous layer passes, and a layer for blue light through which blue light within the white light emitted from said luminous layer passes.

16. The color display apparatus defined in claim 11, wherein each of said color elements comprises a color conversion layer formed on a transparent substrate.

17. The color display apparatus defined in claim 11, wherein each of said color elements comprises a color conversion layer for converting light from said luminous layer into light of a predetermined wavelength.

18. The color display apparatus defined in claim 17, wherein each of said color elements comprises the color conversion layer formed on a transparent substrate, for converting light from said luminous layer into light of a predetermined wavelength.

19. The color display apparatus defined in claim 18, wherein said color conversion layer comprises a layer for red light which converts light emitted from said luminous layer into red light, a layer for green light which converts light emitted from said luminous layer into green light, and a layer for blue light which converts light emitted from said luminous layer into blue light.

20. The color display apparatus defined in claim 11, wherein each of said electroluminescence elements comprises an organic electroluminescence element using an organic material for said luminous layer.

21. A color display apparatus comprising:

a substrate;

thin film transistors formed on said substrate, each of said thin film transistors having a source electrode and a drain electrode; and electroluminescence elements respectively formed over said thin film transistors, each of said electroluminescence elements having a lower electrode connected to one of said source electrode or said drain electrode, a luminous element layer including at least a luminous layer, and a light passing upper electrode, sequentially formed in that order, wherein said luminous layer for each of said electroluminescence elements is formed of a same material, and color filters are respectively provided over said upper electrodes of said electroluminescence elements.

22. The color display apparatus defined in claim 21, wherein color filter layers are respectively formed over said upper electrodes of said electroluminescence elements such that each of said color filter layers is assigned to each of said electroluminescence elements for permitting transmission of light having a predetermined wavelength.

23. The color display apparatus defined in claim 21, wherein said luminous layer is composed of a white color emissive material common to all electroluminescence elements, and each of said color filters comprises a red, green, or blue color filter layer formed over said upper electrode, and each of said color elements is assigned to each of said electroluminescence elements.

24. A color display apparatus having a plurality of display pixels on a substrate, said display pixels comprising:

thin film transistors formed on said substrate, each of said thin film transistors having a source and a drain; and electroluminescence elements respectively formed over said thin film transistors, each of said electroluminescence elements having a lower electrode connected to one of said source or said drain of said thin film transistor, a luminous element layer including at least a luminous layer, and a light passing upper electrode, sequentially formed in that order;

wherein an insulating layer separates at least said luminous layer of each of said display pixels, and respective color elements are provided over said upper electrode of said electroluminescence elements.

25. The color display apparatus defined in claim 24, wherein each of said color elements comprises a color filter layer formed on a transparent substrate.

26. The color display apparatus defined in claim 24, wherein each of said color elements comprises a color filter layer through which can pass light of a predetermined wavelength emitted from said luminous layer.

27. The color display apparatus defined in claim 26, wherein each of said color elements comprises a color filter layer formed on a transparent substrate, said color filter passing light of a predetermined wavelength emitted from said luminous layer.

28. The color display apparatus defined in claim 26, wherein the luminous layer of each of said electroluminescence elements includes a white luminous material, and wherein said color filter layer includes a layer for red light through which red light within white light emitted from said luminous layer passes, a layer for green light through which green light within the white light emitted from said luminous layer passes and a layer for blue light through which blue light within the white light emitted from said luminous layer passes.

29. The color display apparatus defined in claim 24, wherein each of said color elements comprises a color conversion layer formed on a transparent substrate.

30. The color display apparatus defined in claim 24, wherein each of said color elements comprises a color conversion layer for converting light from said luminous layer into light of a predetermined wavelength.

31. The color display apparatus defined in claim 30, wherein each of said color elements comprises the color conversion layer formed on a transparent substrate, for converting light from said luminous layer into light of a predetermined wavelength.

32. The color display apparatus defined in claim 31, wherein said color conversion layer comprises a layer for red light which converts light emitted from said luminous layer into red light, a layer for green light which converts light emitted from said luminous layer into green light, and a layer for blue light which converts light emitted from said luminous layer into blue light.

33. The color display apparatus defined in claim 24, wherein each of said electroluminescence elements comprises an organic electroluminescence element using an organic material for said luminous layer.

* * * * *